(12) United States Patent
Arai et al.

(10) Patent No.: US 11,088,681 B2
(45) Date of Patent: Aug. 10, 2021

(54) HIGH SPEED SIGNAL ADJUSTMENT CIRCUIT

(71) Applicant: MICRON TECHNOLOGY, INC., Boise, ID (US)

(72) Inventors: Tetsuya Arai, Sagamihara (JP); Junki Taniguchi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/358,568

(22) Filed: Mar. 19, 2019

(65) Prior Publication Data
US 2020/0304114 A1 Sep. 24, 2020

(51) Int. Cl.
| | | |
|---|---|---|
| *H03K 3/017* | (2006.01) | |
| *H03K 5/04* | (2006.01) | |
| *H03K 7/08* | (2006.01) | |
| *H03K 5/135* | (2006.01) | |
| *H03K 3/037* | (2006.01) | |
| *G11C 7/10* | (2006.01) | |
| *H03K 17/687* | (2006.01) | |
| *H03M 9/00* | (2006.01) | |

(52) U.S. Cl.
CPC .......... *H03K 5/135* (2013.01); *G11C 7/1057* (2013.01); *H03K 3/037* (2013.01); *H03K 17/6872* (2013.01); *H03M 9/00* (2013.01)

(58) Field of Classification Search
CPC ........ H03K 5/1565; H03K 7/08; H03K 3/017; H03K 5/151; H03L 7/0812
USPC .................................. 327/108–112, 170–175
See application file for complete search history.

(56) References Cited

U.S. PATENT DOCUMENTS

| | | | |
|---|---|---|---|
| 9,178,563 B2* | 11/2015 | Ren ........................... G05F 1/10 | |
| 2002/0079940 A1* | 6/2002 | Boerstler ............. H03K 5/1565 | 327/175 |
| 2013/0176064 A1* | 7/2013 | Lu ..................... H03K 19/00361 | 327/170 |
| 2015/0222254 A1* | 8/2015 | Walker ..................... H03K 5/05 | 327/175 |
| 2017/0324540 A1* | 11/2017 | Jung ....................... G11C 7/106 | |
| 2018/0234096 A1* | 8/2018 | Li ........................... H03K 17/78 | |

* cited by examiner

*Primary Examiner* — Quan Tra
(74) *Attorney, Agent, or Firm* — Dorsey & Whitney LLP

(57) ABSTRACT

Disclosed herein is an apparatus that includes a data serializer including a plurality of first buffer circuits configured to receive a plurality of data, respectively, and a second buffer circuit configured to serialize the plurality of data provided from the plurality of first buffer circuits. At least one of the plurality of first buffer circuits and the second buffer circuit includes: a first circuit configured to drive a first signal node to one of first and second logic levels based on an input signal, the first circuit including a first adjustment circuit configured to adjust a driving capability of the first circuit when the first circuit drives the first signal node to the first logic level; and a second circuit configured to drive the first signal node to other of the first and second logic levels.

20 Claims, 12 Drawing Sheets

HIGH SPEED SIGNAL ADJUSTMENT CIRCUIT

BACKGROUND

The change of timing of a signal on a high speed signal path can be delayed by adjusting the current supply capability of a driver inserted into the signal path. However, when the current supply capability of a driver is lowered, a signal output from the driver may not fully oscillate, which leads to jitter. Therefore, there has been demanded a circuit that can realize full oscillation even if the current supply capability of a driver inserted into a high speed signal path is adjusted.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
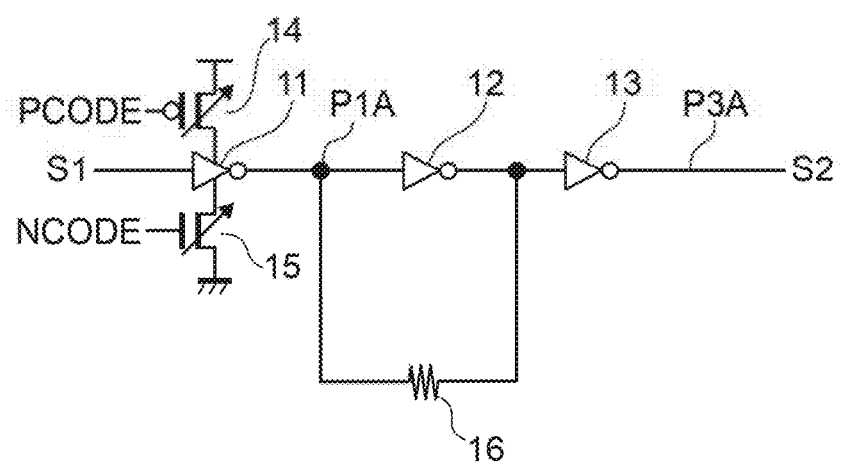
FIG. 1 is a circuit diagram showing an example of a signal path according to the present disclosure.
Figure 2:
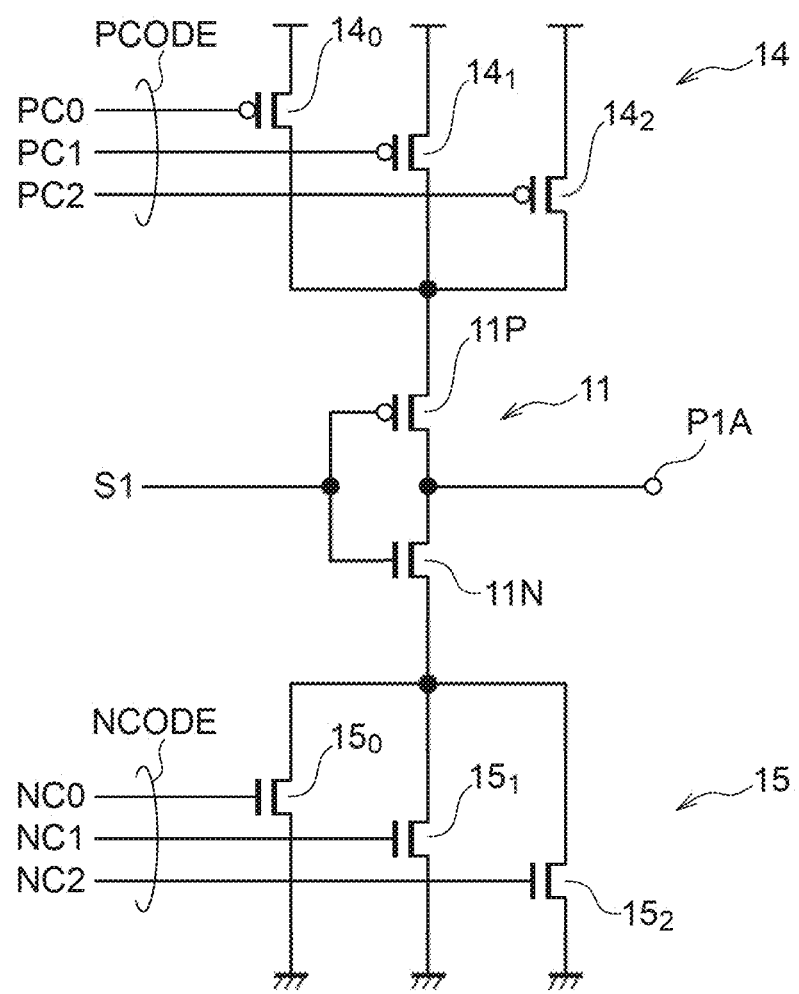
FIG. 2 is a circuit diagram more specifically showing an inverter circuit and an adjustment circuit shown in FIG. 1.

A signal path 10A shown in FIG. 1 includes three inverter circuits 11, 12, and 13 cascade-connected in this order. A signal S1 is input to the inverter circuit 11 at the first stage and a signal S2 is output from the inverter circuit 13 at the last stage. The inverter circuit 11 includes an adjustment circuit 14 that adjusts the pull-up capability of a signal node P1A and an adjustment circuit 15 that adjusts the pull-down capability of the signal node P1A. The adjustment circuit 14 adjusts the amount of a current flowing from a power line supplied with a power potential to the inverter circuit 11 on the basis of a code signal PCODE. The adjustment circuit 15 adjusts the amount of a current flowing from the inverter circuit 11 to a power line supplied with a ground potential on the basis of a code signal NCODE. As shown in FIG. 2, the adjustment circuit 14 includes a plurality of P-channel MOS transistors $14_0$ to $14_2$ connected in parallel. Bits PC0 to PC2 constituting the code signal PCODE are supplied to gate electrodes of the transistors $14_0$ to $14_2$, respectively. Tire adjustment circuit 15 includes a plurality of N-channel MOS transistors $15_0$ to $15_2$ connected in parallel. Bits NC0 to NC2 constituting the code signal NCODE are supplied to gate electrodes of the transistors $15_0$ to $15_2$, respectively. The respective numbers of bits of the code signals PCODE and NCODE are not particularly limited to any specific number. The current supply capabilities of the transistors included in each of the adjustment circuits 14 and 15 can be different from one another. The inverter circuit 11 includes a P-channel MOS transistor 11P having a source connected to the adjustment circuit 14, and an N-channel MOS transistor 11N having a source connected to the adjustment circuit 15.

The inverter circuit 12 has an input node and an output node short-circuited via a resistor circuit 16. Accordingly, the inverter circuit 12 and the resistor circuit 16 constitute a de-emphasis circuit and restrict the maximum amplitude of the node P1A. For example, when the signal S1 is at a high level, the transistor 11N included in the inverter circuit 11 is turned on and accordingly the node P1A has a low level. However, because an output at a high level is provided to the node P1A from the inverter circuit 12 via the resistor circuit 16, the level of the node P1A becomes a predetermined level determined by the on-resistances of the transistor 11N and the adjustment circuit 15, and the ratio between the on-resistance of the inverter circuit 12 and the resistance value of the resistor circuit 16. The same holds true for a case where the signal S1 is at a low level and the level of the node P1A becomes a predetermined level determined by the on-resistances of the transistor 11P and the adjustment circuit 14, and the ratio between the on-resistance of the inverter circuit 12 and the resistance value of the resistor circuit 16. Therefore, even in a case where the current supply capability of the adjustment circuit 14 or the adjustment circuit 15 is set to the minimum value, only the amplitude changes and a signal appearing on the node P1A always fully oscillates. Accordingly, even if the value of the code signal PCODE or NCODE is changed, no jitter occurs.

Figure 3:
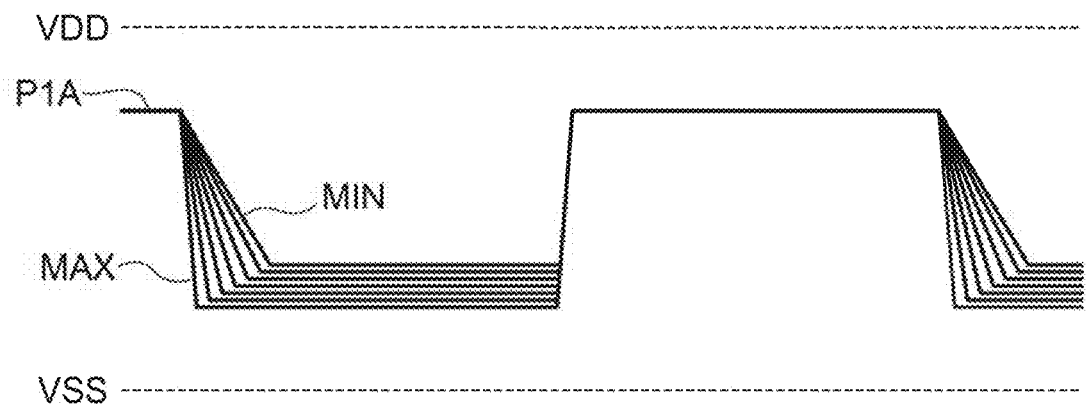
FIG. 3 and FIG. 4 are waveform diagrams respectively showing signal waveforms on the signal path shown in FIG. 1.
Figure 4:
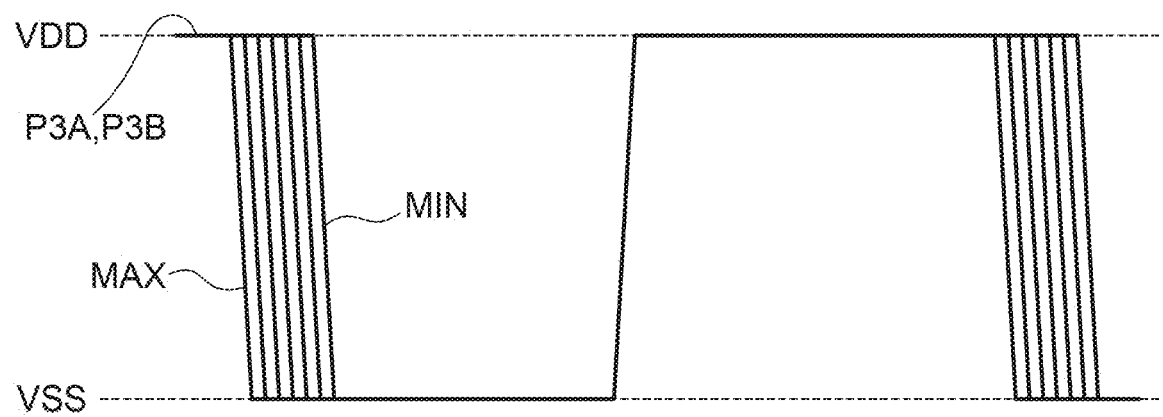

FIG. 3 shows waveforms of the signal appearing on the node P1A when the code signal NCODE is changed in the signal path 10A. First, when the code signal NCODE is set to the maximum value and the transistors $15_0$ to $15_2$ are all turned on, the change speed at which the level of the node P1A changes from a high level to a low level becomes highest as indicated by a waveform MAX. When the value of the code signal NCODE is then gradually reduced, the current supply capability of the adjustment circuit 15 gradually lowers. Therefore, the speed at which the level of the node P1A changes from a high level to a low level gradually reduces and the amplitude decreases. When the code signal NCODE is set to the minimum value, the change speed at which the level of the node P1A changes from a high level to a low level becomes lowest as indicated by a waveform MIN. Accordingly, the timing when the signal S2 appearing on a node P3A falls can be adjusted by the value of the code signal NCODE as shown in FIG. 4. Similarly, the timing when the signal S2 rises can be adjusted by the value of the code signal PCODE.

Figure 5:
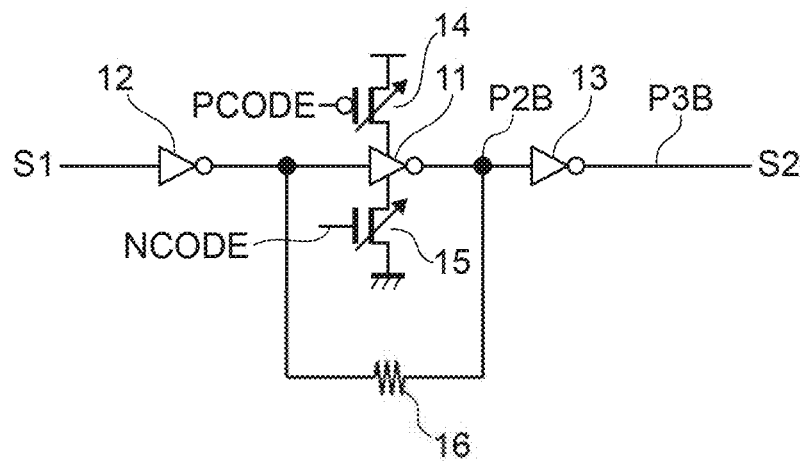
FIG. 5 is a circuit diagram showing another example of the signal path according to the present disclosure.

A signal path 10B shown in FIG. 5 includes the three inverter circuits 12, 11, and 13 cascade-connected in this order. The signal S1 is input to the inverter circuit 12 at the first stage and the signal S2 is output from the inverter circuit 13 at the last stage. In the signal path 10B, an input node and an output node of the inverter circuit 11 are short-circuited via the resistor circuit 16. Accordingly, the inverter circuit 11 and the resistor circuit 16 constitute a de-emphasis circuit and restrict the maximum amplitude of a node P2B. For example, when the signal S1 is at a high level, the transistor 11P included in the inverter circuit 11 is turned on and accordingly the node P2B becomes a high level. However, because a low-level output is provided to the node P2B from the inverter circuit 12 via the resistor circuit 16, the level of the node P2B becomes a predetermined level determined by the on-resistances of the transistor 11P and the adjustment circuit 14, and the ratio between the on-resistance of the inverter circuit 12 and the resistance value of the resistor circuit 16. The same holds true for a case where the signal S1 is at a low level and the level of the node P2B becomes a predetermined level determined by the on-resistance of the transistor 11N and the adjustment circuit 15, and the ratio between the on-resistance of the inverter circuit 12 and the resistance value of the resistor circuit 16. Therefore, even in a case where the current supply capability of the adjustment circuit 14 or the adjustment circuit 15 is set to the minimum value, only the amplitude changes and a signal appearing on the node P2B always fully oscillates. Accordingly, even if the value of the code signal PCODE or NCODE is changed, no jitter occurs.

Figure 6:
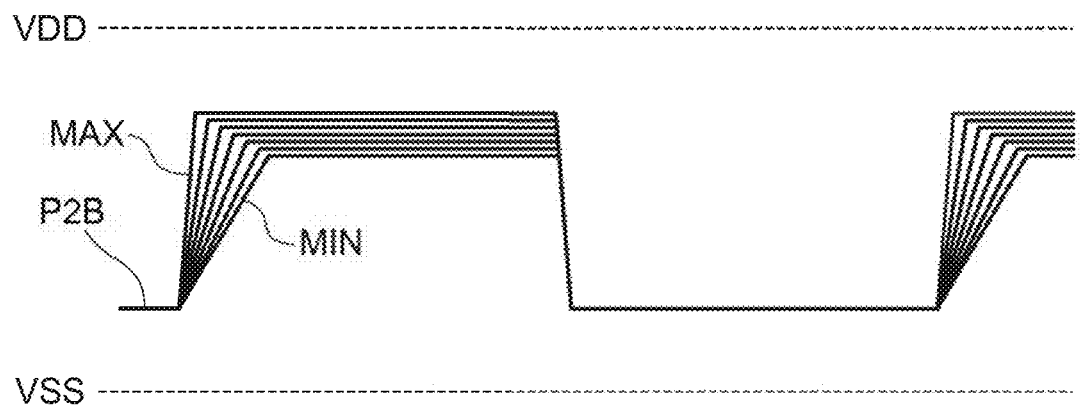
FIG. 6 is a waveform diagram showing signal waveforms on the signal path shown in FIG. 5.

FIG. 6 shows waveforms of the signal appearing on the node P2B when the code signal PCODE is changed in the signal path 10B. First, when the code signal PCODE is set to the maximum value and the transistors $14_0$ to $14_2$ are all turned on, the change speed at which the level of the node P2B changes from a low level to a high level becomes highest as indicated by a waveform MAX. When the value of the code signal PCODE is gradually reduced, the current supply capability of the adjustment circuit 14 gradually lowers. Therefore, the speed at which the level of the node P2B changes front a low level to a high level gradually reduces and the amplitude decreases. When the code signal PCODE is set to the minimum value, the change speed at which the level of the node P2B changes from a low level to a high level becomes lowest as indicated by a waveform MIN. Accordingly, the timing when the signal S2 appearing on the node P3B falls can be adjusted by the value of the code signal PCODE as shown in FIG. 4. Similarly, the timing when the signal S2 rises can be adjusted by the value of the code signal NCODE.

Figure 7:
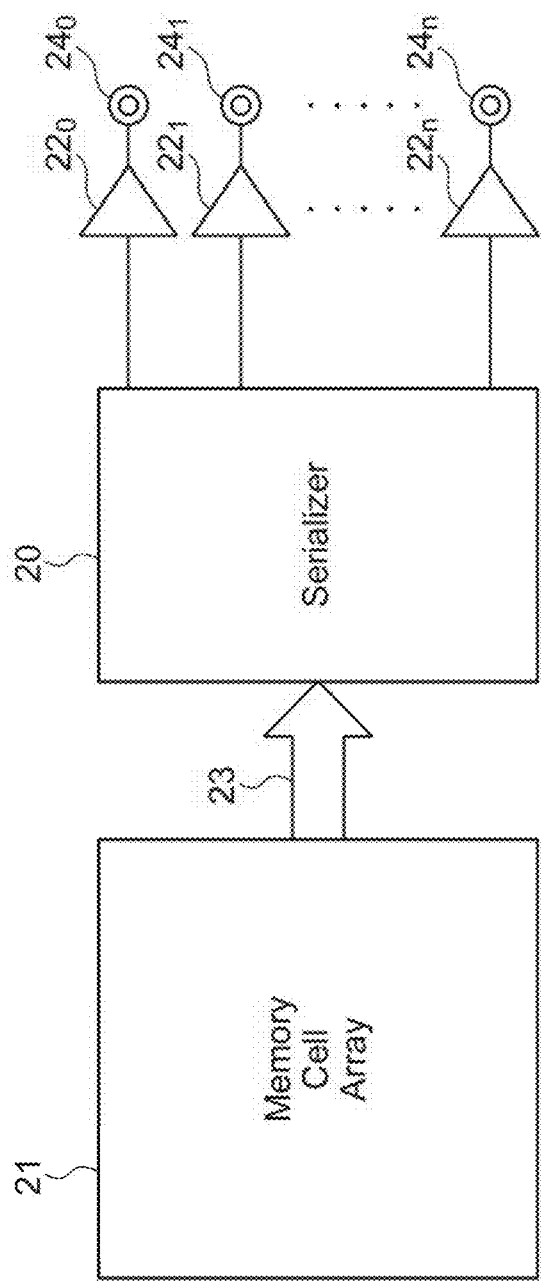
FIG. 7 is a block diagram for explaining connection points of a serializer.

The signal paths 10A and 10B described above can be used as a high speed signal path included in a serializer. As shown in FIG. 7, a serializer 20 can be placed between a memory cell array 21 and output buffer circuits 22. In this case, parallel read data 23 output from the memory cell array 21 is convened by the serializer 20 into serial data and is supplied to the output buffer circuits 22. In the example shown in FIG. 7, a plurality of data terminals $24_0$ to $24_n$ are provided and a plurality of output buffer circuits $22_0$ to $22_n$ are provided correspondingly. In this case, while an input path of the serializer 20 is a relatively-low speed signal path, an output path of the serializer 20 is a high speed signal path.

Figure 8:
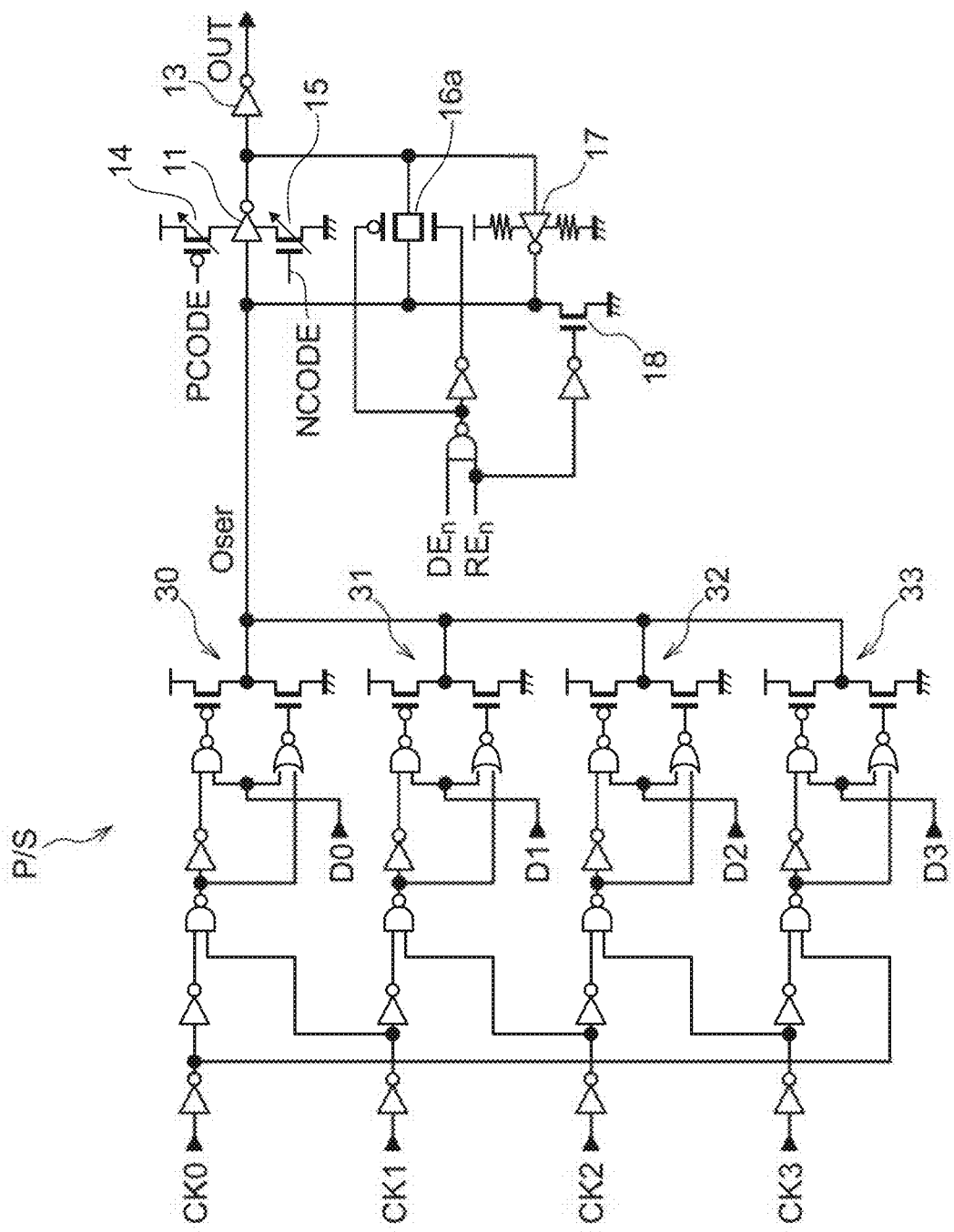
FIG. 8 is a circuit diagram showing an example in which the signal path shown in FIG. 5 is applied to a serializer.
Figure 9:
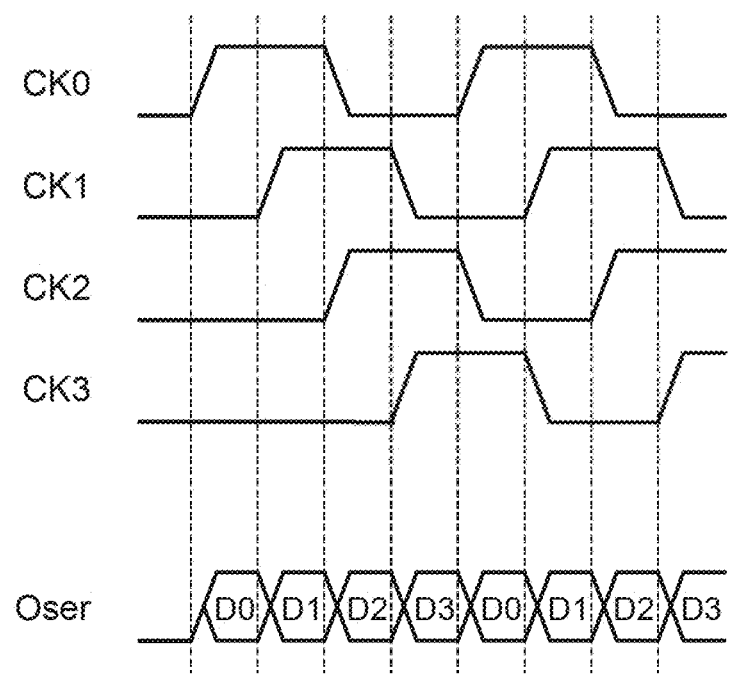
FIG. 9 is a waveform diagram showing signal waveforms on the serializer shown in FIG. 8.

FIG. 8 shows a parallel/serial conversion circuit P/S that converts parallel read data D0 to D3 into serial data, and the inverter circuits 11 and 13 connected at the subsequent stage. The parallel/serial conversion circuit P/S includes four tristate buffer circuits 30 to 33. One of the tristate buffer circuits 30 to 33 is activated and outputs of the remaining three tristate buffer circuits become a high impedance state on the basis of clock signals CK0 to CK3. The clock signals CK0 to CK3 are four-phase clock signals having phases different from one another by 90 degrees as shown in FIG. 9. The tristate buffer circuits 30 to 33 output the read data D0 to D3 to a signal node Oser in response to rising edges of the clock signals CK0 to CK3, respectively. Therefore, the frequency of the serial read data D0 to D3 appearing on the signal node Oser is twice as high as the frequency of the parallel read data D0 to D3 input to the parallel/serial conversion circuit P/S.

The parallel/serial conversion circuit P/S and the inverter circuits 11 and 13 connected at the subsequent stage correspond to the signal path 10B shown in FIG. 5. In the circuit shown in FIG. 8, the resistor circuit 16 shown in FIG. 5 is replaced by a transfer gate 16a. Further, an inverter circuit 17 having a significantly small driving capability and a transistor 18 that resets the signal node Oser to a low level are added. The transistor 18 is turned off during a period when a read enable signal $RE_n$ is activated to a high level and is turned on during a period when the read enable signal $RE_n$ is deactivated to a low level. When the transistor 18 is turned on, the signal node Oser is fixed to a low level. When the read enable signal $RE_n$ is activated, the transistor 18 is turned off and the read data D0 to D3 appearing on the signal node Oser is output via the inverter circuits 11 and 13. When a de-emphasis enable signal $DE_n$ has been activated to a high level at this time, the transfer gate 16a is turned on and accordingly the input node and the output node of the inverter circuit 11 are short-circuited via the transfer gate 16a. Therefore, the same function as that of the circuit shown in FIG. 5 can be realized. On the other hand, when the de-emphasis enable signal $DE_n$ has been deactivated to a low level, the transfer gate 16a is turned off and accordingly the de-emphasis operation is not performed. The de-emphasis enable signal $DE_n$ is activated when the frequency of the read data D0 to D3 appearing on the signal node Oser is high and is deactivated when the frequency of the read data D0 to D3 appearing on the signal node Oser is low. Accordingly current consumption can be reduced when the frequency of the read data D0 to D3 is low.

Figure 10:
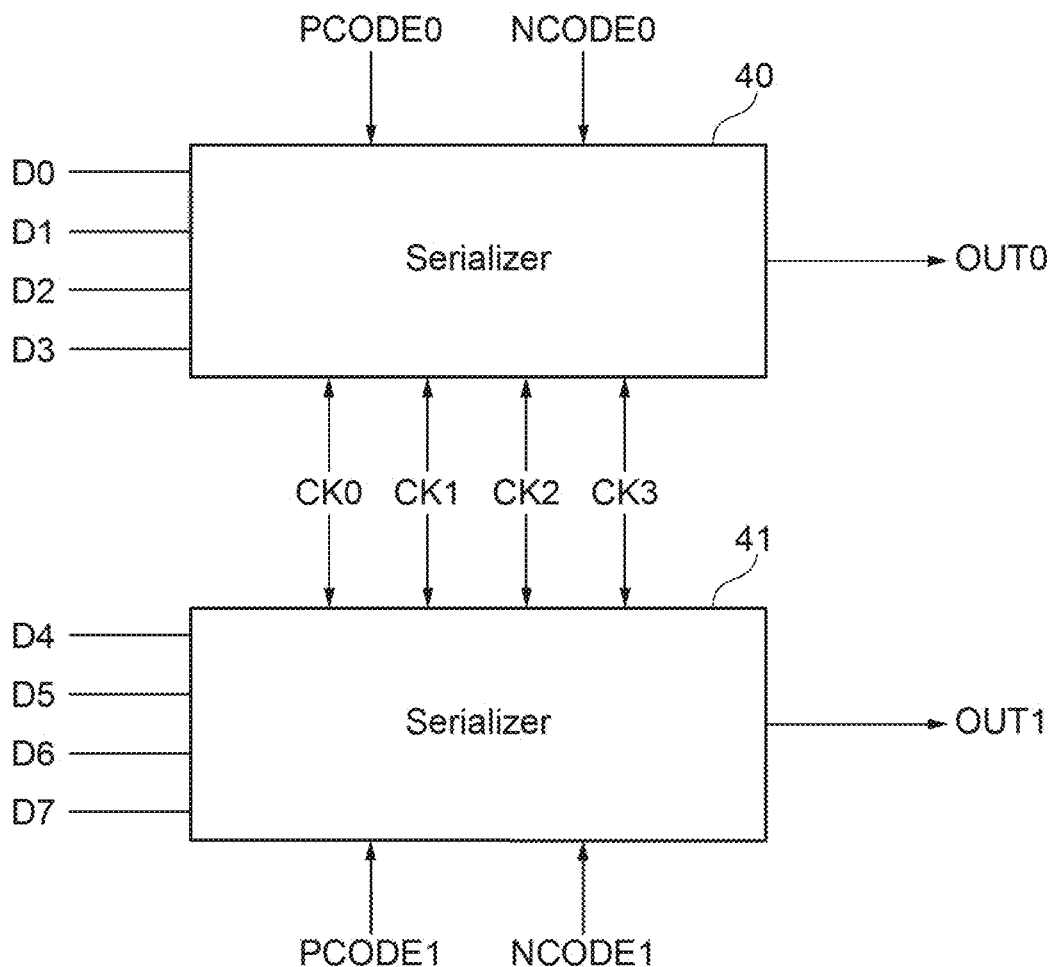
FIG. 10 is a block diagram showing two serializers.

Plural sets of the circuits shown in FIG. 8 can be included in the inside of the serializer 20 shown in FIG. 7. For example, two serializers 40 and 41 each having the same circuit configuration as that shown in FIG. 8 can be provided as shown in FIG. 10. Parallel read data D0 to D3 is input to the serializer 40 and different parallel read data D4 to D7 is input to the serializer 41. The clock signals CK0 to CK3 are common to the serializers 40 and 41. Code signals PCODE0 and NCODE0 are input to the serializer 40 and different code signals PCODE1 and NCODE1 are input to the serializer 41. When a plurality of the serializers 40 and 41 are used in parallel in this way, the delay amounts of output signals can be controlled independently using separate axle signals, respectively.

Figure 11:
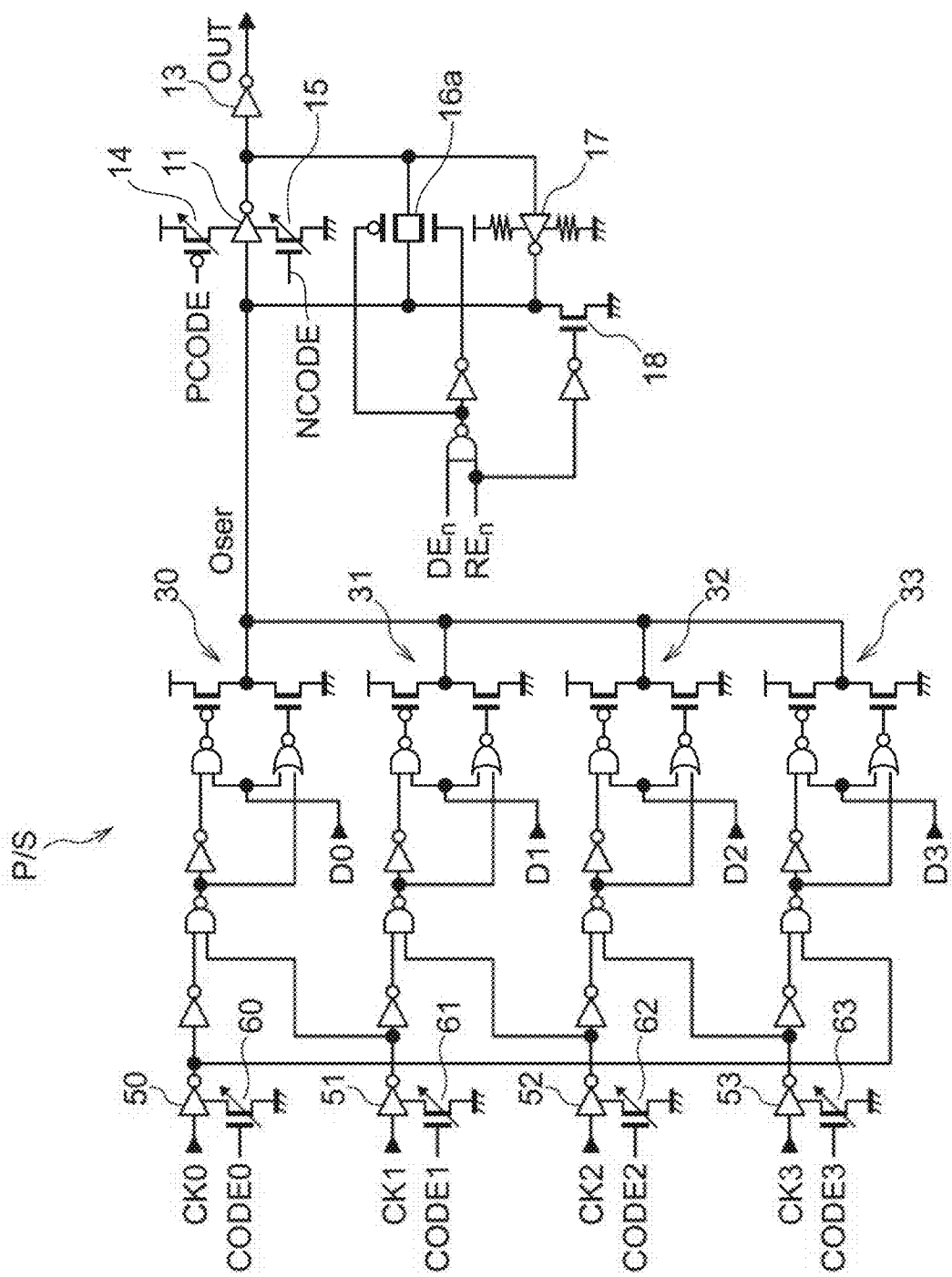
FIG. 11 is a circuit diagram showing another example in which the signal path shown in FIG. 5 is applied to a serializer.

The parallel/serial conversion circuit P/S shown in FIG. 11 is different from the parallel/serial conversion circuit P/S shown in FIG. 8 in that adjustment circuits 60 to 63 are provided in inverter circuits 50 to 53 that receive the clock signals CK0 to CK3, respectively. The adjustment circuits 60 to 63 are connected between the inverter circuits 50 to 53 and a power line supplied with the ground potential, respectively, and the current supply capabilities thereof are adjusted by code signals CODE0 to CODE3, respectively. Accordingly, even when the phases of the clock signals CK0 to CK3 input to the parallel/serial conversion circuit P/S are slightly deviated from setting values, the phases of the clock signals CK0 to CK3 output from the inverter circuits 50 to 53 can be caused to be different from one another accurately by 90 degrees.

Figure 12:
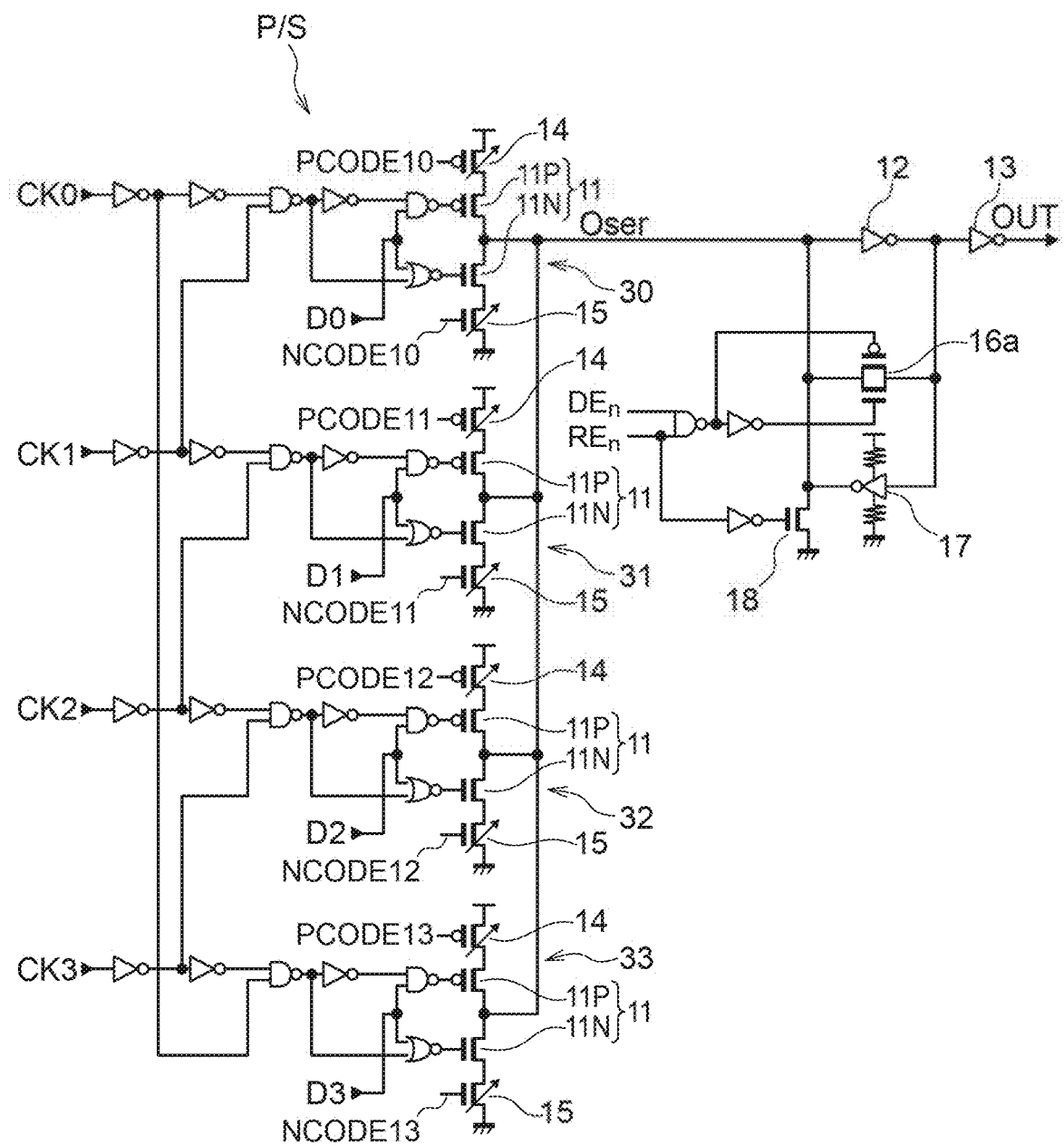
FIG. 12 is a circuit diagram showing an example in which the signal path shown in FIG. 1 is applied to a serializer.

The parallel/serial conversion circuit P/S shown in FIG. 12 has a configuration in which the adjustment circuits 14 and 15 are provided in each of the tristate buffer circuits 30 to 34 shown in FIG. 8. The inverter circuits 12 and 13 are connected in series at the subsequent stage of the signal node Oser. The input node and the output node of the inverter circuit 12 are short-circuited via the transfer gate 16a. The tristate buffer circuits 30 to 34 and the inverter circuits 12 and 13 connected at the subsequent stage correspond to the signal path 10A shown in FIG. 1. Code signals PCODE10 and NCODE10 are respectively supplied to the adjustment circuits 14 and 15 provided in the tristate buffer circuit 30, code signals PCODE11 and NCODE11 are respectively supplied to the adjustment circuits 14 and 15 provided in the tristate buffer circuit 31, code signals PCODE12 and NCODE12 are respectively supplied to the adjustment circuits 14 and 15 provided in the tristate buffer circuit 32, and code signals PCODE13 and NCODE13 are respectively supplied to the adjustment circuits 14 and 15 provided in the tristate buffer circuit 33. Also with this circuit configuration, the same function as that of the serializer shown in FIG. 11 can be realized.

Figure 13:
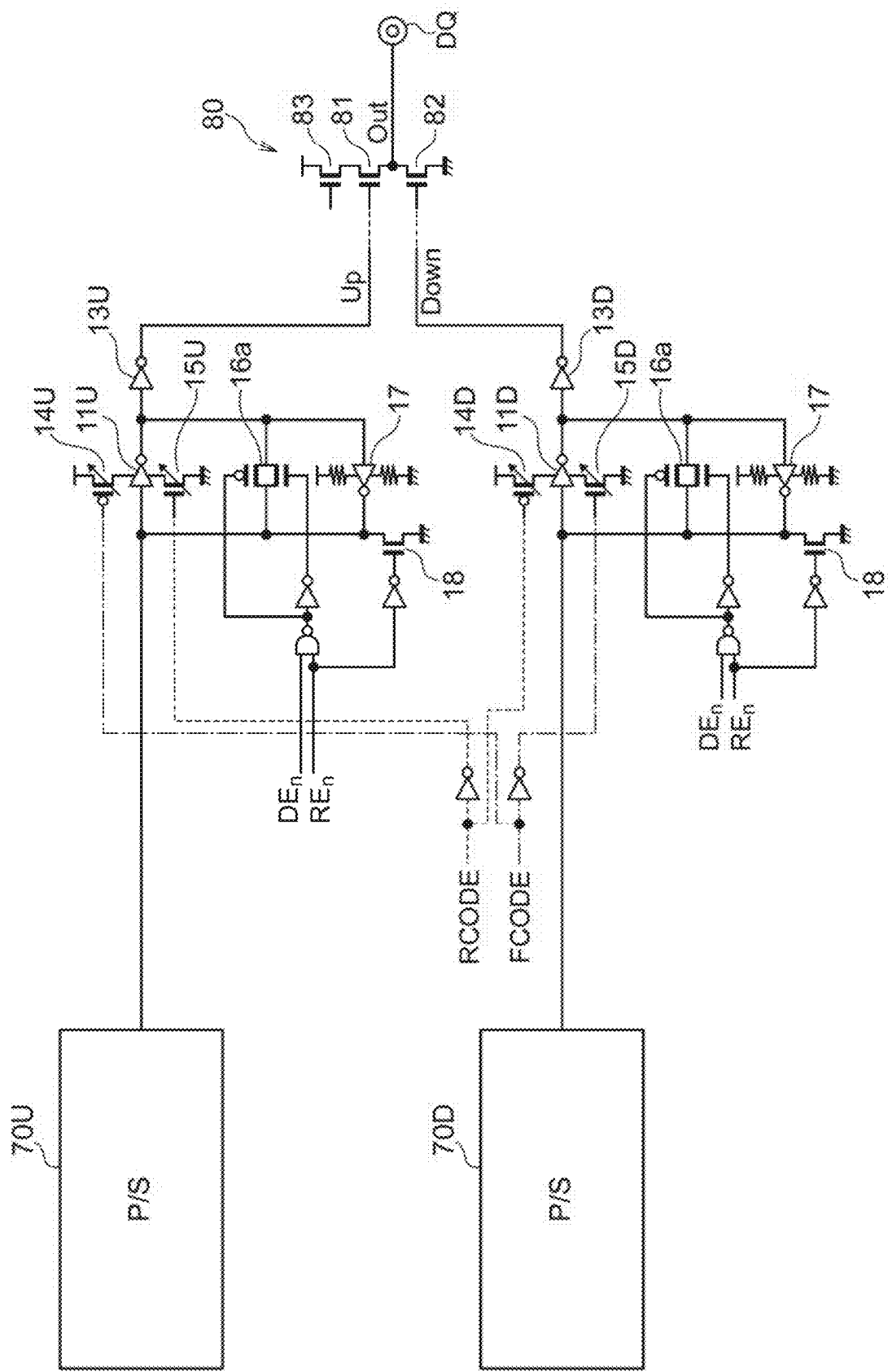
FIG. 13 is a circuit diagram showing an example in which a signal path for driving an output buffer circuit is divided into a pull-up signal path and a pull-down signal path.

As shown in FIG. 13, the parallel/serial conversion circuit P/S can be provided to each of a pull-up signal path and a pull-down signal path. In the example shown in FIG. 13, a pull-up signal Up output from a parallel/serial conversion circuit 70U is supplied to a gate electrode of a pull-up transistor 81 included in an output buffer circuit 80 via inverter circuits 11U and 13U, and a pull-down signal Down output from a parallel/serial conversion circuit 70D is supplied to a gate electrode of a pull-down transistor 82 included in the output buffer circuit 80 via inverter circuits 11D and 13D. The output buffer circuit 80 has a configuration in which a transistor 83, the transistors 81, and the transistor 82 are connected in series, and a data output terminal DQ is connected to a connection point between the transistors 81 and 82.

In this circuit configuration, a common code signal RCODE is supplied to an adjustment circuit 15U and an adjustment circuit 14D, and a common code signal FCODE is supplied to an adjustment circuit 14U and an adjustment circuit 15D. However, because polarities of the transistors in the adjustment circuit 15U and the adjustment circuit 14D are opposite to each other, the logic levels of a plurality of bits constituting the code signal RCODE are all inverted. Similarly, the polarities of the transistors in the adjustment circuit 14U and the adjustment circuit 15D are opposite to each other and therefore the logic levels of a plurality of bits constituting the code signal FCODE are all inverted.

Figure 14A:
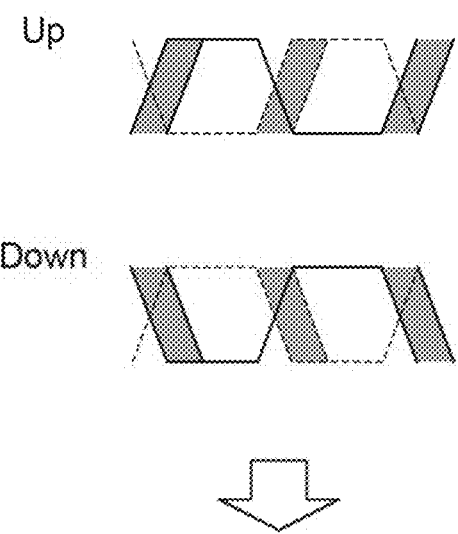
FIG. 14A and FIG. 14B are waveform diagrams respectively showing signal waveforms on a serializer shown in FIG. 13.
Figure 14B:
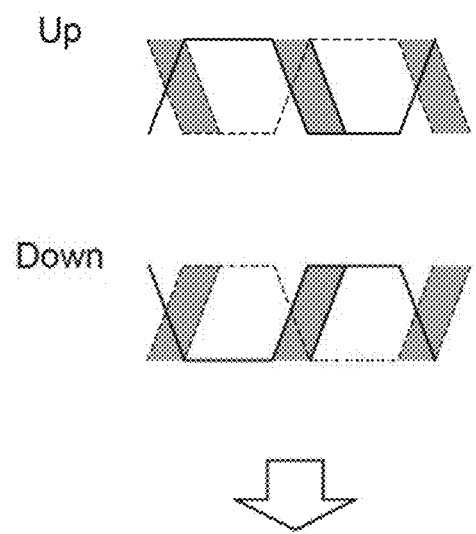

When the code signal RCODE is gradually reduced from the maximum value, rising of the pull-up signal Up supplied to the output buffer circuit 80 is gradually delayed and falling of the pull-down signal Down supplied to the output buffer circuit 80 is also gradually delayed as shown in FIG. 14A. As a result, rising of an output signal Out output from the data output terminal DQ is gradually delayed, so that the cross point lowers. On the other hand, when the code signal FCODE is gradually reduced from the maximum value, falling of the pull-up signal Up supplied to the output buffer circuit 80 is gradually delayed and rising of the pull-down signal Down supplied to the output buffer circuit 80 is also gradually delayed as shown in FIG. 14B. As a result, falling of the output signal Out output from the data output terminal DQ is gradually delayed, so that the cross point rises. In this way, the cross point of the output signal Out can be adjusted by the code signal RCODE or FCODE.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying modes of the disclosed invention. Thus, it is intended that the scope of at least some of the present invention herein disclosed should not be limited by the particular disclosed embodiments described above.

The invention claimed is:

1. An apparatus comprising:
a data serializer including a plurality of first buffer circuits configured to receive a plurality of data, respectively, and a second buffer circuit configured to serialize the plurality of data provided from the plurality of first buffer circuits;
wherein at least one of the plurality of first buffer circuits and the second buffer circuit includes:
a first circuit configured to drive a first signal node to one of first and second logic levels based on an input signal, the first circuit including a first adjustment circuit configured to adjust a driving capability of the first circuit when the first circuit drives the first signal node to the first logic level; and
a second circuit configured to drive the first signal node to the other of the first and second logic levels, wherein an output of the first circuit is coupled to an input of the second circuit, wherein the second circuit is further configured to short-circuit the input and an output of the second circuit based on a mode signal.

2. The apparatus of claim 1, wherein the first circuit further includes a first inverter circuit having an input node supplied with the input signal and an output node connected to the first signal node.

3. The apparatus of claim 2, wherein the first adjustment circuit is connected between a first power line supplying a first power potential and the first inverter circuit.

4. The apparatus of claim 3, wherein the first adjustment circuit includes a plurality of transistors connected in parallel.

5. The apparatus of claim 1, wherein the first circuit further includes a second adjustment circuit configured to adjust a driving capability of the first circuit when the first circuit drives the first signal node to the second logic level.

6. The apparatus of claim 1, wherein the second circuit includes a second inverter circuit having an input node and an output node each connected in common to the first signal node.

7. The apparatus of claim 6, wherein the second circuit further includes a resistor circuit connected between the input node of the second inverter circuit and the output node of the second inverter circuit.

8. The apparatus of claim 2, wherein the second circuit includes a resistor circuit connected between the input node of the first inverter circuit and the output node of the first inverter circuit.

9. The apparatus of claim 1, wherein the second buffer circuit includes the first and second circuits.

10. The apparatus of claim 1, wherein the data serializer is configured to select one of the plurality of data based on a plurality of clock signals having different phases from one another.

11. The apparatus of claim 10,
wherein the data serializer includes a plurality of clock driver circuits each supplied with an associated one of the plurality of clock signals, and
wherein each of the clock driver circuits is configured to be able to adjust a driving capability thereof.

12. The apparatus of claim 1, wherein each of the first buffer circuits includes the first and second circuits.

13. The apparatus of claim 1, wherein the second circuit is configured to be deactivated based on the mode signal.

14. The apparatus of claim 1, further comprising:
another data serializer including a plurality of third buffer circuits configured to receive the plurality of data, respectively, and a fourth buffer circuit configured to serialize the plurality of data provided from the plurality of third buffer circuits;
wherein at least one of the plurality of third buffer circuits and the fourth buffer circuit includes:
a third circuit configured to drive a second signal node to the other of first and second logic levels based on an input signal, the third circuit including a third adjustment circuit configured to adjust a driving capability of the third circuit when the third circuit drives the second signal node to the second logic level; and
a fourth circuit configured to drive the second signal node to the one of the first and second logic levels,
wherein the apparatus further comprises an output buffer circuit having a pull-up transistor and a pull-down transistor connected in series,
wherein the pull-up transistor has a control electrode coupled to the first signal node, and
wherein the pull-down transistor has a control electrode coupled to the second signal node.

15. An apparatus comprising:
first and second signal nodes;
a data serializer including a plurality of tristate buffer circuits each having an input node supplied with an associated one of a plurality of input signals and an output node connected to the first signal node;
an inverter circuit having an input node connected to the first signal node and an output node connected to the second signal node;
a first circuit configured to adjust a driving capability of the inverter circuit based on an adjustment code signal;
a second circuit configured to short-circuit the first and second signal nodes when a mode signal is activated; and a second inverter circuit having an input node connected to the second signal node and an output node connected to the first signal node.

16. An apparatus comprising:
pull-up transistor and pull-down transistor connected in series;
a first data serializer converting a first signal in parallel into serial;
a second data serializer converting a second signal in parallel into serial;
a first inverter circuit having an input node supplied with the first signal in serial and an output node coupled to a control electrode of the pull-up transistor;
a second inverter circuit having an input node supplied with the second signal in serial and an output node coupled to a control electrode of the pull-down transistor;
a first adjustment circuit connected between a first power line supplying a first power potential and the first inverter circuit and configured to control a current flowing from the first power line to the first inverter circuit;
a second adjustment circuit connected between a second power line supplying a second power potential and the first inverter circuit and configured to control a current flowing from the first inverter circuit to the second power line;
a third adjustment circuit connected between the first power line and the second inverter circuit and configured to control a current flowing from the first power line to the second inverter circuit;
a fourth adjustment circuit connected between the second power line and the second inverter circuit and configured to control a current flowing from the second inverter circuit to the second power line;
a first circuit configured to short-circuit the input and output nodes of the first inverter circuit; and
a second circuit configured to short-circuit the input and output nodes of the second inverter circuit.

17. The apparatus of claim 16,
wherein the first adjustment circuit is controlled by a first adjustment code signal, and
wherein the second adjustment circuit is controlled by a second adjustment code signal different from the first adjustment code signal.

18. The apparatus of claim 17,
wherein the third adjustment circuit is controlled by the second adjustment code signal, and
wherein the fourth adjustment circuit is controlled by the first adjustment code signal.

19. The apparatus of claim 18, wherein the first and second circuits are configured to be deactivated based on a mode signal.

20. The apparatus of claim 1, wherein the first circuit further includes a first inverter circuit having an input node supplied with the input signal and an output node connected to the first signal node, and wherein the second circuit includes a second inverter circuit having an input node and an output node each connected in common to the first signal node.

* * * * *